(12) United States Patent
Nishii (10) Patent No.: US 7,685,707 B2
(45) Date of Patent: Mar. 30, 2010

(54) METHOD FOR MANUFACTURING CIRCUIT FORMING SUBSTRATE

(75) Inventor: Toshihiro Nishii, Osaka (JP)

(73) Assignee: Panasonic Corporation, Osaka (JP)

( * ) Notice: Subject to any disclaimer, the term of this patent is extended or adjusted under 35 U.S.C. 154(b) by 214 days.

(21) Appl. No.: 11/814,037

(22) PCT Filed: Mar. 16, 2006

(86) PCT No.: PCT/JP2006/305252

§ 371 (c)(1),
(2), (4) Date: Jul. 16, 2007

(87) PCT Pub. No.: WO2006/098406

PCT Pub. Date: Sep. 21, 2006

(65) Prior Publication Data

US 2009/0183366 A1 Jul. 23, 2009

(30) Foreign Application Priority Data

Mar. 17, 2005 (JP) ............................ 2005-076815

(51) Int. Cl.
*H01K 3/10* (2006.01)
*B32B 38/04* (2006.01)

(52) U.S. Cl. .................. 29/852; 29/825; 29/830; 29/843; 156/273.9

(58) Field of Classification Search ............. 29/825, 29/830, 843, 852; 156/273.9
See application file for complete search history.

(56) References Cited

U.S. PATENT DOCUMENTS

| | | | | | |
|---|---|---|---|---|---|
| 3,795,047 | A | * | 3/1974 | Abolafia et al. | ............... 29/843 |
| 5,175,047 | A | * | 12/1992 | McKenney et al. | ......... 428/209 |
| 5,502,889 | A | * | 4/1996 | Casson et al. | ................. 29/830 |
| 5,800,650 | A | * | 9/1998 | Anderson et al. | ........... 156/150 |
| 5,979,044 | A | * | 11/1999 | Sumi et al. | .................... 29/830 |

FOREIGN PATENT DOCUMENTS

| | | |
|---|---|---|
| JP | 04-286188 A | 10/1992 |
| JP | 05-251865 | 9/1993 |
| JP | 06-268345 | 9/1994 |
| JP | 2000-133912 A | 5/2000 |
| JP | 2000-151102 A | 5/2000 |
| JP | 2000-307246 A | 11/2000 |
| JP | 2001-024326 A | 1/2001 |
| JP | 2003-249753 A | 9/2003 |

OTHER PUBLICATIONS

International Search Report for Application No. PCT/JP2006/305252, dated Jun. 13, 2006.

* cited by examiner

*Primary Examiner*—C. J Arbes
(74) *Attorney, Agent, or Firm*—RatnerPrestia (57) ABSTRACT

A stable and high quality circuit forming substrate is provided even when the work size is increased in the circuit forming substrate. In a stacking step, prepregs that are B stage substrate materials, are arranged lined with respect to a first metal foil, and stacked on the first metal foil. A C stage substrate material is stacked on the B stage substrate materials. Further, the prepregs that are two or more B stage substrate materials, are stacked on the C stage substrate material and a second metal foil is stacked thereon.

16 Claims, 7 Drawing Sheets

METHOD FOR MANUFACTURING CIRCUIT FORMING SUBSTRATE

This application is a U.S. National Phase application of PCT International Application PCT/JP2006/305252, filed Mar. 16, 2006.

TECHNICAL FIELD

The present invention relates to a method for manufacturing a circuit forming substrate used in various electronic equipments.

BACKGROUND ART

Recently, with miniaturization and higher density of electronic equipments, a double-sided, multi-layer substrate is being more widely used than a conventional one-sided substrate for a circuit forming substrate for mounting electronic components, and a high density substrate in which a greater number of circuits and components can be integrated on a substrate have been developed.

Figure 8A:
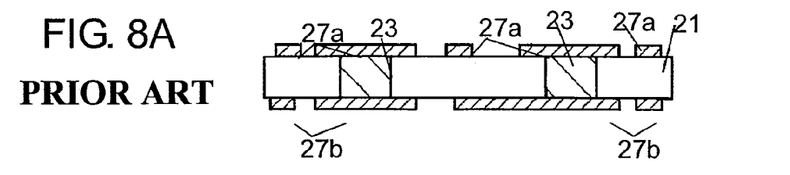
FIG. 8A is a cross sectional view showing a method for manufacturing a circuit forming substrate of a conventional art.

FIG. 8A to FIG. 8E show manufacturing steps of the conventional circuit forming substrate. As shown in FIG. 8A, circuits 27a, 27b are respectively formed on one main surface and other main surface of core substrate material 21, individually. FIG. 8A shows a double-sided substrate formed with inter-layer connecting part 23 by conductive paste. Note that a multi-layer substrate may also be used other than the double-sided substrate. In addition to the conductive paste, various methods such as plating, soldering, or the like can be adopted for inter-layer connecting part 23.

Figure 8B:
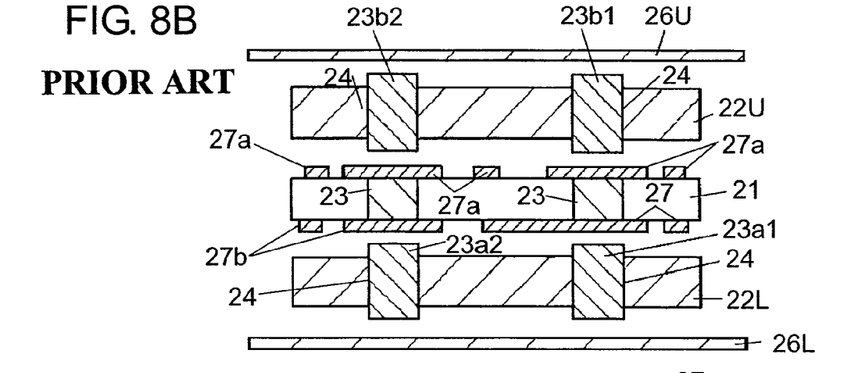
FIG. 8B is a cross sectional view showing the method for manufacturing the circuit forming substrate of the conventional art.

Prepregs 22L and 22U are then arranged on the top and the bottom thereof so as to sandwich core substrate material 21, as shown in FIG. 8B. Conductive pastes 23a1, 23a2, 23b1 and 23b2 are arranged in via holes 24 of prepregs 22L, 22U. Copper foil 26L that is a first metal foil and copper foil 26U that is a second metal foil are respectively arranged on prepreg 22L side and 22U side. Since prepregs 22L, 22U contain half-cured resin, cooper foils 26L, 26U and prepregs 22L, 22U or prepregs 22L, 22U and core substrate material 21 are partially temporary pressure bonded with heater tool and the like in positioning. The positional shift in subsequent handling is thereby prevented.

Figure 8C:
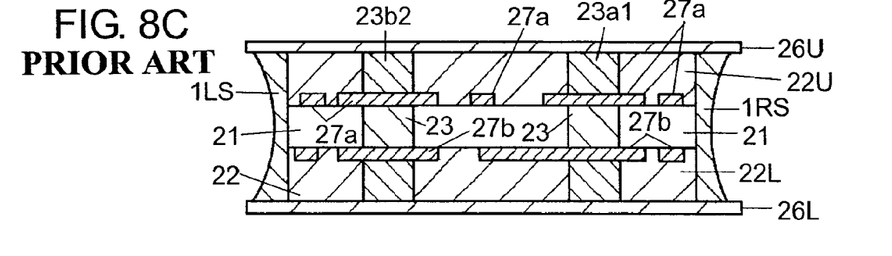
FIG. 8C is a cross sectional view showing the method for manufacturing the circuit forming substrate of the conventional art.

Heat and pressure are then applied by the heat press device (not shown) to cure prepregs 22L, 22U to be integrated with core substrate material 21, as shown in FIG. 8C. Conductive pastes 23a1, 23a2, 23b1, and 23b2 are also compressed and cured, thereby exerting conductivity and electrically connecting the layers.

Figure 8D:
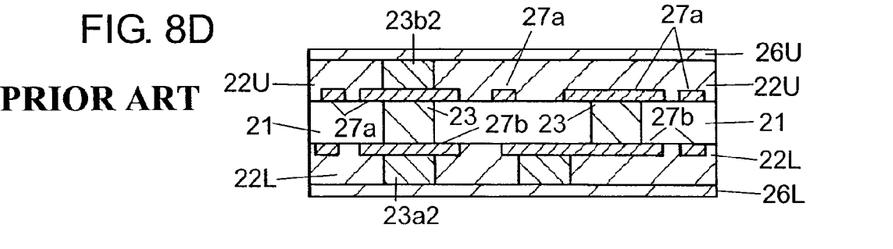
FIG. 8D is a cross sectional view showing the method for manufacturing the circuit forming substrate of the conventional art.
Figure 8E:
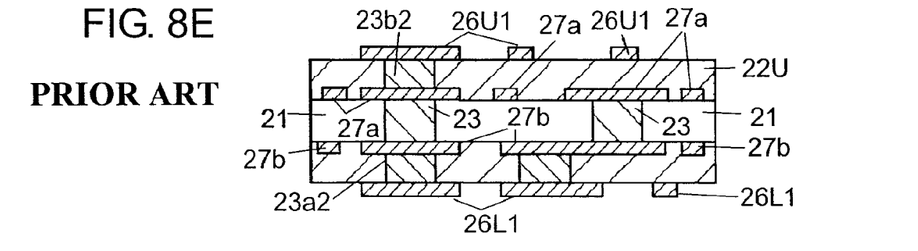
FIG. 8E is a cross sectional view showing the method for manufacturing the circuit forming substrate of the conventional art.

The extra portions at the end face of the circuit forming substrate are then cut to obtain a four-layer circuit forming substrate as shown in FIG. 8D, copper foils 26L, 26U at the surface are etching processed to form circuits 26L1, 26U1, and the four-layer circuit forming substrate as shown in FIG. 8E is obtained.

Depending on the application, solder resist for soldering is applied to the surface of the circuit forming substrate shown in FIG. 8E or gold plating or surface processing such as flux processing or soldering lever is performed on the surface of circuits 26L1, 26U1. Subsequently, the substrate is cut to the desired sheet size with a die, rooter process, or the like and provided to the circuit forming substrate in the assembly step of the electrical equipment and the like. Japanese Patent Publication, Japanese Patent Un-examined Publication No. H06-268345 is known as the conventional art document information related to the invention of the subject application.

However, in the method for manufacturing the circuit forming substrate described above, manufacturing constraints are restricted when attempting to increase the size of prepregs 22L, 22U. That is, jigs and the like cannot be contacted to prepregs 22L, 22U since non-cured conductive paste 23a1, 23a2, 23b1, and 23b2 are arranged. If contacted, the conductive paste spreads to the periphery, whereby drawbacks arise, for example, electrical short between the circuit and another circuit occurs or the reliability of inter-layer connection lowers.

Prepregs 22L, 22U must be stored in a hollow supporting jig so that conductive paste 23a1, 23a2, 23b1, and 23b2 are not damaged from the outside. When handling prepreg 22L, 22U during a stacking step, only the end faces thereof can be gripped, and thus is subjected to manufacturing constraints. The difficulty in handling task in the stacking step becomes higher as the size of prepregs 22L, 22U becomes larger. Thus, the reliability of the quality also becomes unreliable in terms of manufacturing the circuit forming substrate.

Furthermore, since positioning with circuits 27a, 27b on core substrate material 21 becomes difficult when the positions of conductive pastes 23a1, 23a2, 23b1, and 23b2 arranged in prepregs 22L, 22U vary, correspondence to miniature circuit forming substrate is difficult. The variation in the position of conductive paste 23a1, 23a2, 23b1, and 23b2 thus cannot be ignored as the size of prepregs 22L, 22U increases.

In order to reduce the manufacturing cost of the circuit forming substrate, on the other hand, increasing the size of prepregs 22L, 22U, that is, the work size in manufacturing is effective in terms of production efficiency. Thus, embodiment of a manufacturing method for stably manufacturing the circuit forming substrate having a large work size is desired.

DISCLOSURE OF THE INVENTION

In the method for manufacturing the circuit forming substrate of the present invention, two or more substrate materials are arranged lined (side by side) on an identical metal foil in the stacking step. Alternatively, two or more B stage substrate materials are stacked with respect to the C stage substrate materials. Furthermore, two or more C stage substrate materials may be stacked with respect to the B stage substrate materials.

According to such configuration, manufacturing of stable and high quality circuit forming substrate is performed even if the work size in manufacturing is increased.

Specifically, the method for manufacturing the circuit forming substrate of the present invention includes:

(a) a metal foil, a metal foil attached to a supporting body, a metal foil attached to the supporting body and formed with a circuit pattern;

(b) a B stage substrate material including at least one of a circuit and an inter-layer connecting means, or a B state substrate material including neither the circuit nor the inter-layer connecting means;

(c) a C stage substrate material including at least one of a circuit and an inter-layer connecting means;

The method for manufacturing the circuit forming substrate includes a stacking step of stacking (a) the metal foil, (b) the B stage substrate material and (c) the C stage substrate material as stacking object. In the stacking step, the two or more substrates at least one of (b) the B stage substrate material and (c) the C stage substrate material are prepared and arranged side by side with respect to (a) the metal foil. Thus, the work size in manufacturing can be increased, and stripping sheet becomes unnecessary since the metal foil acts as the stripping sheet in the heat press step, and the like after the stacking step.

In another method for manufacturing the circuit forming substrate of the present invention, the two or more B stage substrate materials are arranged side by side with respect to the C stage substrate material. The work size in manufacturing can be increased. Moreover, a so-called collective stacking method can be adopted by using the circuit forming substrate as the C stage substrate material, and thus production efficiency enhances.

In the method for manufacturing another circuit forming substrate of the present invention, the circuit forming substrate includes the B stage substrate material at least, and the two or more C stage substrate materials are arranged side by side on the same B stage substrate material.

Thus, the work size in manufacturing can be increased, and the size of the C stage substrate material can be reduced even if the thickness of the C stage substrate material is thin and handling is difficult, whereby the handling ability enhances.

The method for manufacturing another circuit forming substrate of the present invention includes a step of positioning and arranging side by side the two or more first B stage substrate materials on a first (lower side) metal foil in the stacking step. The stacking step also includes a step of positioning and arranging side by side the C stage substrate material on the first B stage substrate material. The stacking step also includes a step of positioning and arranging side by side the two or more second (upper side) B stage substrate materials on the C stage substrate material. Moreover, the stacking step also includes a step of mounting a second (upper side) metal foil on the B stage substrate material.

This structure allows that handling, mounting, stacking, and positioning of substrate materials such as prepreg are facilitated even if the work size is increased by sequentially stacking the stacking objects on the upper side with the first metal foil (lower side) as the reference, and positioning accuracy enhances, whereby a precise circuit forming substrate can be obtained.

In another method for manufacturing the circuit forming substrate of the present invention, the step of mounting the B stage substrate material, the C stage substrate material, and the metal foil includes a step of temporary holding after arranging side by side, mounting, or stacking. Therefore, handling, arranging side by side, mounting, stacking, and positioning of the substrate materials such as prepreg are facilitated even if the work size is increased. The positioning workability enhances through temporary holding, and positioning accuracy enhances by achieving stable stacking.

In another method for manufacturing the circuit forming substrate of the present invention, a clearance dimension between the substrate materials adjacent to each other is defined as a space of when the two or more substrate materials such as core substrate materials and prepregs are arranged side by side in the step of stacking the two or more substrate materials with respect to the metal foil. These spaces, that is, the clearance dimension is selected in the range of 3 mm to 0.2 mm. Thus, when the circuit is formed on the core substrate material or the like, penetration of etchant and production of gap and void between the adjacent substrate materials are prevented, and filling performance between the substrate materials is enhanced. Furthermore, workability is enhanced by ensuring the operating rage in time of positioning.

In another method for manufacturing the circuit forming substrate of the present invention, the substrate materials adjacent to each other are formed into a shape that adjacent portions fit to each other in the stacking step of arranging side by side, mounting, and stacking the two or more substrate materials on the same metal foil. According to such configuration, the bending strength of the circuit forming substrate is enhanced when the substrate materials adjacent to each other are stacked while being fitted to each other.

In another method for manufacturing the circuit forming substrate of the present invention, the two or more substrate materials in the stacking step uses B stage substrate materials. The substrate material is formed into two or more by being divided from that having a thickness of not more than 100 μm and a short side of a rectangular shape exceeding 350 mm, or that having a thickness of not more than 60 μm and one side exceeding 200 mm. In particular, if the B stage substrate material such as prepreg configured with the above thickness and dimension is used in a divided manner, the handling of the substrate material is stabilized even if the work size in manufacturing of the circuit forming substrate is increased, thereby enabling the manufacturing of the circuit forming substrate using a thinner substrate material of larger size.

In another method for manufacturing the circuit forming substrate of the present invention, the B stage substrate material uses a woven cloth for reinforcement material. When the woven cloth using fiber such as glass is used for the reinforcement material of the prepreg serving as the substrate material, the stacking task can be stably performed while compensating for the lack of rigidity in the prepreg state of the woven cloth while exerting effects such as dimension stability of the woven cloth.

As described above, in the method for manufacturing the circuit forming substrate of the present invention, the two or more substrate materials are stacked with respect to the same metal foil in the stacking step. Alternatively, the two or more B stage substrate materials are stacked with respect to the same C stage substrate material in the stacking step. Furthermore, the two or more C stage substrate materials may be stacked with respect to the B stage substrate material in the stacking step.

According to the configuration of the present invention, a performance of handling of the substrate material is progressive, thereby enabling the manufacturing of the circuit forming substrate may be used of thinner substrate material having larger size compared to the conventional manufacturing method even if the work size in manufacturing of the circuit forming substrate is increased.

In particular, when the woven cloth using fiber such as glass is used for the reinforcement martial of the prepreg serving as the substrate material, significant effect is obtained of stabilizing the stacking task while compensating for the lack of rigidity in the prepreg stage of the woven cloth while exerting effects such as dimension stability of the woven cloth.

Furthermore, according to the method for manufacturing the circuit forming substrate of the present invention, high quality and high density circuit forming substrate can be provided while greatly enhancing the reliability of the electrical connection between the layers using the inter-layer connecting part such as conductive paste.

Furthermore, in another method for manufacturing the circuit forming substrate of the present invention, the two or more C stage substrate materials are stacked contacting each other at a specific site with respect to the same B stage. According to such configuration, the work size in manufacturing is increased, and manufacturing of stable and high quality circuit forming substrate can be performed.

In the specific method for manufacturing the circuit forming substrate of the present invention, the two or more C stage substrate materials are arranged side by side on the same B stage substrate material, and stacked contacting each other at the specific site in the stacking step. Thus, the circuit forming substrate having a large work size can be manufactured. The yield of the substrate material to be used thus increases and enhances productivity of the individual circuit forming substrate.

In the method for manufacturing the circuit forming substrate of the present invention, a cutting step of cutting the portion at where the two or more C stage substrate materials stacked in the stacking step contact to a desired dimension is provided before the stacking step. The effective range of the work size after stacking, that is, the usable range as the circuit forming substrate increases, and a method of manufacturing an efficient and low cost circuit forming substrate is realized.

In the method for manufacturing the circuit forming substrate of the present invention, the stacking object circuit formed on one main surface or the other main surface of the circuit forming substrate is a multi-layer circuit forming substrate, and the multi-layer circuit forming substrate includes a plurality of assembled circuit forming substrates. The specific site, where the two or more C stage substrate materials contact, is positioned between the assembled circuit forming substrates adjacent to each other. The effective range of the work size after stacking, that is, the usable range as the circuit forming substrate thereby increases. Thus, the taking-out number of assembled circuit forming substrate increases and manufacturing of efficient and low cost circuit forming substrate is achieved.

In the method for manufacturing the circuit forming substrate of the present invention, the stacking object circuit formed on one main surface or the other main surface of the circuit forming substrate is a multi-layer circuit forming substrate, and the multi-layer circuit forming substrate includes a plurality of assembled circuit forming substrates configured by a plurality of individual circuit forming substrates. The specific site, where at least the two or more C stage substrate materials contact, is positioned between the individual circuit forming substrates adjacent to each other in at least one assembled circuit forming substrate. The effective range of the work size after stacking the circuit forming substrate, that is, the usable range as the circuit forming substrate thereby increases. Thus, the taking-out number of the individual circuit forming substrate increases and manufacturing of efficient and low cost circuit forming substrate is realized.

In the method for manufacturing the circuit forming substrate of the present invention, the portion, where the C stage substrate materials contact each other is formed to a fitting shape. The strength of the assembled circuit forming substrate can be increased by such configuration. Furthermore, in the method of manufacturing the circuit forming substrate of the present invention, cutting is performed by a dicing method. Through the use of the dicing method, the space between the two C stage substrate materials can be made not less than 100 μm. The C stage substrate materials specify the portion contacting each other at high precision.

In the method for manufacturing the circuit forming substrate of the present invention, the C stage substrate material further includes a circuit and an inter-layer connecting part formed by conductive paste on the surface; and the surface of the multi-layer circuit forming substrate includes laser via. The multi-layer circuit forming substrate can be easily manufactured even when the work size is large, and the manufacturing cost can be reduced.

According to the present invention, the handling of the substrate material is stabilized even if the work size in manufacturing of the circuit forming substrate is increased, thereby enabling the manufacturing of the circuit forming substrate using a thinner substrate material having a large size compared to the conventional manufacturing method.

The usable range as the circuit forming substrate in the work size after stacking increases, whereby the taking-out number of the individual circuit forming substrate is increased, and manufacturing of efficient and low cost circuit forming substrate is realized.

In particular, when the woven cloth using fiber such as glass is used for the reinforcement martial of the prepreg serving as the substrate material, significant effect is obtained of stabilizing the stacking task while compensating for the lack of rigidity in the prepreg stage of the woven cloth while exerting effects such as dimension stability of the woven cloth.

Furthermore, according to the method for manufacturing the circuit forming substrate of the present invention, high quality and high density circuit forming substrate can be provided while greatly enhancing the reliability of the electrical connection between the layers using an inter-layer connecting part such as conductive paste.

REFERENCE MARKS IN THE DRAWINGS 1, 1R, 1L core substrate material
2, 2L1, 2L2, 2U1, 2U2 prepreg
3a, 3b inter-layer connecting part
5a1, 5a2, 5b1, 5b2 conductive paste
6L, 6L1, 6L2, 6U copper foil
7a, 7b circuit
8L, 8U sheet
9 laser via hole
10L, 10U laser via
11 tool mark
12, 12a assembled circuit forming substrate
13a, 13b individual circuit forming substrate
14 specific site

PREFERRED EMBODIMENTS FOR CARRYING OUT OF THE INVENTION

The embodiments of the present invention will now be described with reference to the drawings.

First Embodiment

FIG. 1A to FIG. 1E are cross sectional views showing a method for manufacturing a circuit forming substrate according to a first embodiment of the present invention.

Figure 1A:
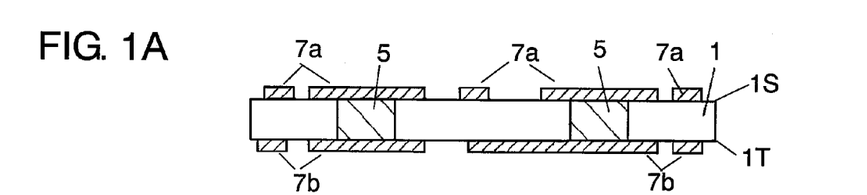
FIG. 1A is a cross sectional view showing a method for manufacturing a circuit forming substrate according to a first embodiment of the present invention.

Circuit 7a is formed on one main surface 1S of core substrate material 1 shown in FIG. 1A. Another circuit 7b is formed on other main surface 1T of core substrate material 1. Core substrate material 1 is illustrated as a double-sided plate with conductive paste 5 arranged as an inter-layer connecting part, but may be used as a multi-layer circuit substrate. Various other methods such as plating, soldering, or the like (not shown) may also be used other than conductive paste 5 for connecting circuit 7a on one main surface 1S side and circuit 7b on other main surface 1T side, or a so-called inter-layer connecting part.

Core substrate material 1 is in a C stage state. In the present invention, C stage state refers to a cured state. Note that a B stage, to be hereinafter described, is defined as a state in which curing is advanced to a certain extent but gel state also remains.

Figure 1B:
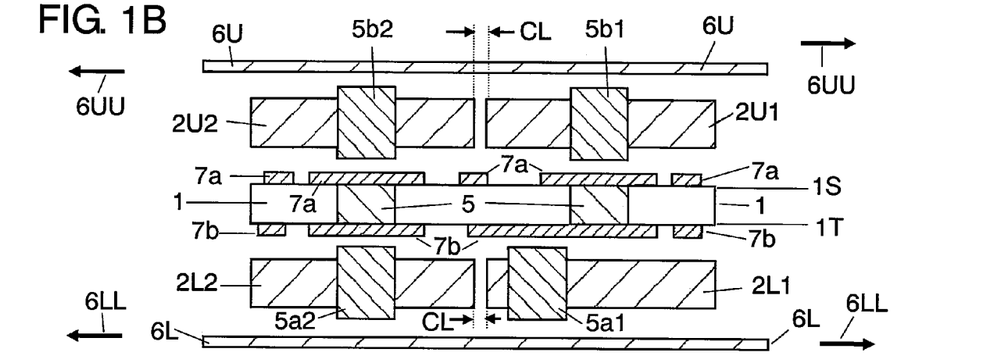
FIG. 1B is a cross sectional view showing the method for manufacturing the circuit forming substrate according to the first embodiment of the present invention.

The positioning of core substrate material 1 and prepregs 2L1, 2L2, 2U1, and 2U2 including conductive paste 5, 5a1, 5a2, 5b1, and 5b2 and prepared as the B stage substrate material is performed as shown in FIG. 1B. Subsequently, copper foils 6L, 6U are also positioned and arranged at the predetermined location. That is, copper foil 6L on the lower side is positioned and arranged on prepregs 2L1, 2L2 side, and copper foil 6U on the upper side is positioned and arranged on prepregs 2U1, 2U2 side. Prepregs 2L1, 2L2 are placed at a lower side of core substrate material 1 and prepregs 2U1, 2U2 are placed at an upper side of core substrate material 1.

Copper foil 6L is specifically prepared for the first (lower side) metal foil. Two first (lower side) prepregs 2L1, 2L2 are arranged side by side with predetermined clearance dimension CL on copper foil 6L in longitudinal direction 6LL. Core substrate material 1 shown in FIG. 1A is then arranged on prepregs 2L1, 2L2. On core substrate material 1, Second (upper side) prepreg 2U1 is positioned with respect to prepreg 2L1 and prepreg 2U2 is positioned with respect to prepreg 2L2. Thereafter, prepreg 2U1, 2U2 are arranged side by side on core substrate material 1. Prepregs 2U1, 2U2 are arranged together in longitudinal direction 6UU of copper foil 6U or the second metal foil with predetermined clearance dimension CL.

Copper foil 6U that is a second (upper side) metal foil is arranged on second prepregs 2U1, 2U2. That is, a configuration in which first prepregs 2L1, 2L2 are arranged side by side along the longitudinal direction of copper foil 6L that is the first metal foil and copper foil 6U that is the second metal foil, and prepregs 2L1, 2L2, core substrate material 1, and prepregs 2U1, 2U2 are stacked between copper foil 6L and second copper foil 6U is shown in FIG. 1B.

Figure 1C:
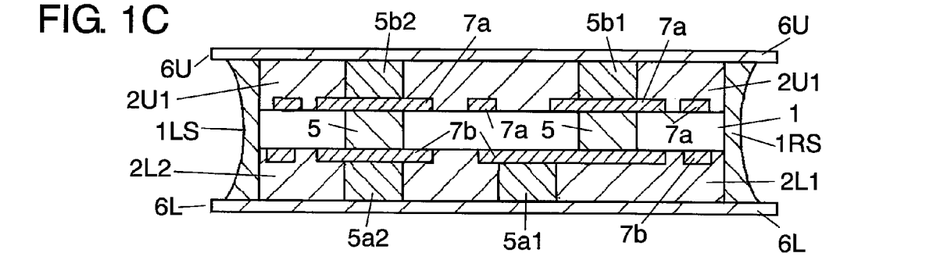
FIG. 1C is a cross sectional view showing the method for manufacturing the circuit forming substrate according to the first embodiment of the present invention.

FIG. 1C shows a state in which core substrate material 1, each prepregs etc. are temporary held. That is, lower side prepregs 2L1, 2L2 are positioned with respect to lower side copper foil 6L, and temporary held with a heater tool and the like (not shown). Core substrate material 1 is then mounted and temporary held while being positioned with respect to lower side prepregs 2L1, 2L2. Upper side prepregs 2U1, 2U2 are then mounted and temporary held while being positioned with respect to core substrate material 1. Subsequently, upper side copper foil 6U is mounted, and the side surfaces of lower side copper foil 6L, upper side copper foil 6U, and prepregs 2U1, 2U2, 2L1, and 2L2 are covered and fixed with temporary holding members 1RS, 1LS, thereby suppressing the position shift of the circuit in subsequent handling. After temporary holding with temporary holding member 1RS, 1LS, pressurizing and heating process is performed with the heat press device (not shown) to cure and integrate prepregs 2U1, 2U2, 2L1, and 2L2. Conductive paste 5, 5a1, 5a2, 5b1, and 5b2 are also compressed and cured, thereby exerting conductivity and electrically connecting the layers of the circuit substrate.

Figure 1D:
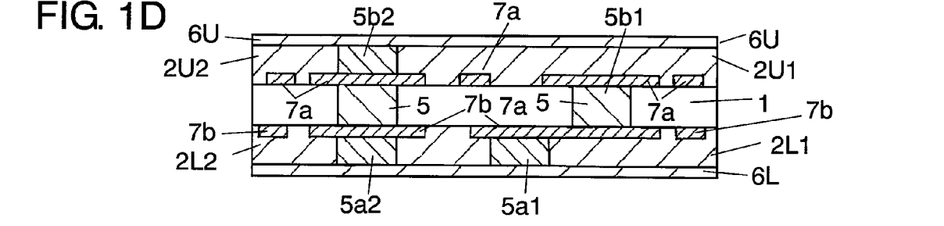
FIG. 1D is a cross sectional view showing the method for manufacturing the circuit forming substrate according to the first embodiment of the present invention.

FIG. 1D shows the four-layer circuit substrate obtained by cutting the extra portion at the periphery of temporary holding members 1RS, 1LS shown in FIG. 1C.

Figure 1E:
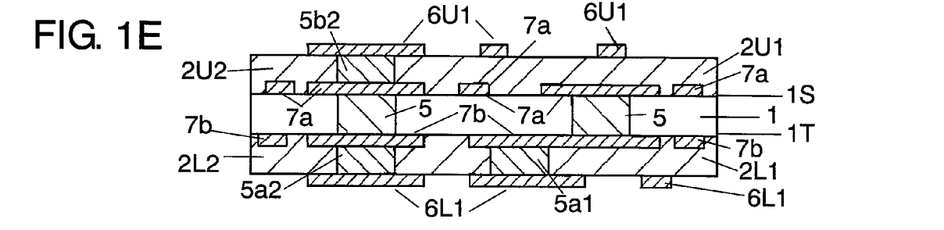
FIG. 1E is a cross sectional view showing the method for manufacturing the circuit forming substrate according to the first embodiment of the present invention.

FIG. 1E shows the four-layer circuit forming substrate after the required portions of copper foils 6U, 6L are etched and circuits 6U1, 6L1 are formed. Note that four-layer herein refers to the configuration including circuits 6L1, 7b, 7a, and circuit 6U1 from the lower side.

In the conventional task order of positioning prepregs 2U1, 2U2 on one main surface 1S side of core substrate material 1 and prepregs 2L1, 2L2 on other main surface 1T side and temporary holding the same, and thereafter arranging and positioning copper foils 6U, 6L, the handling of the substrate material is complicated and the manufacturing device also become complex compared to the task order of the present invention.

In the method for manufacturing the circuit forming substrate according to the first embodiment of the present invention, the stacking objects are sequentially stacked on the upper side with the lower side copper foil 6L as the reference. In stacking, the lower side prepreg is divided into two pieces such as prepregs 2L1 and 2L2. That is, two prepregs 2L1, 2L2 that are divided are arranged side by side along longitudinal direction 6LL of copper foil 6L that is the first metal foil. The upper side prepreg is also divided into two pieces such as prepregs 2U1 and 2U2. Upper side prepregs 2U1, 2U2 are arranged side by side along longitudinal direction 6UU of upper side copper foil 6U. According to such configuration, the size of each prepreg is not less than half the conventional size, that is when not divided, even if the size of core substrate material 1, that is, the work size in the step is increased, and thus handling, stacking, and positioning of prepregs 2U1, 2U2, 2L1, and 2L2 are facilitated.

Furthermore, since the upper side prepreg is divided into two pieces such as prepregs 2U1, 2U2, as described above, the variation in the positions of conductive paste 5a1, 5a2 is suppressed small.

The variation in the positions of conductive paste 5a1, 5a2, 5b1, and 5b2 is caused by variation etc. in the hole position in hole processing before filling prepregs 2L1, 2L2, 2U1, and 2U2 with conductive paste 5a1, 5a2, 5b1, and 5b2. However, the accuracy of positioning enhances by reducing the size of prepregs 2L1, 2L2, 2U1, and 2U2 that is, dividing the prepregs into few portions, and positioning each on core substrate material 1.

A number to divide the upper side and the lower side prepregs into can be adjusted by work size and the like. For example, division into four or division into six is possible.

The inventors performed various reviews and found that when the thickness of the prepreg is about 100 μm and the shape thereof is a rectangle, division of the prepreg into two or more is found to be effective if the short side exceeds 350 mm.

Alternatively, the dividing method for when the short side of the prepreg exceeds 200 mm is found to be effective if the thickness of the prepreg is not more than 60 μm.

Second Embodiment

FIG. 2A to FIG. 2E are cross sectional views showing a method for manufacturing a circuit forming substrate according to a second embodiment of the present invention. The manufacturing steps shown in the second embodiment are substantially entirely the same as the first embodiment. The large difference lies in that core substrate material 1 is also divided in addition to dividing the prepreg.

Figure 2A:
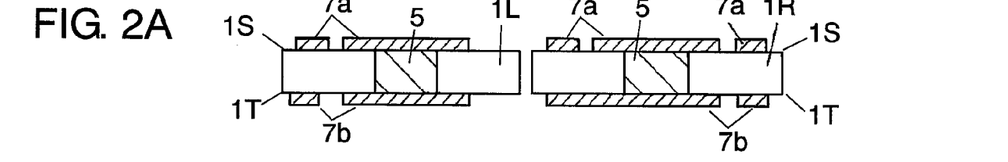
FIG. 2A is a cross sectional view showing a method for manufacturing a circuit forming substrate according to a second embodiment of the present invention.

FIG. 2A shows two core substrate materials 1R, 1L. The configuration in which the core substrate material is divided into two differs from that of the first embodiment. Circuits 7a, 7b are respectively formed on one main surface 1S, and other main surface 1T of core substrate material 1R, 1L. Core substrate materials 1R, 1L are illustrated as a double-sided plate including an inter-layer connecting part for connecting circuit 7a and circuit 7b with conductive paste 5, but may be used as a multi-layer circuit substrate. Various other methods such as plating, soldering, or the like (not shown) may also be used other than conductive paste 5 for the inter-layer connecting part.

Figure 2B:
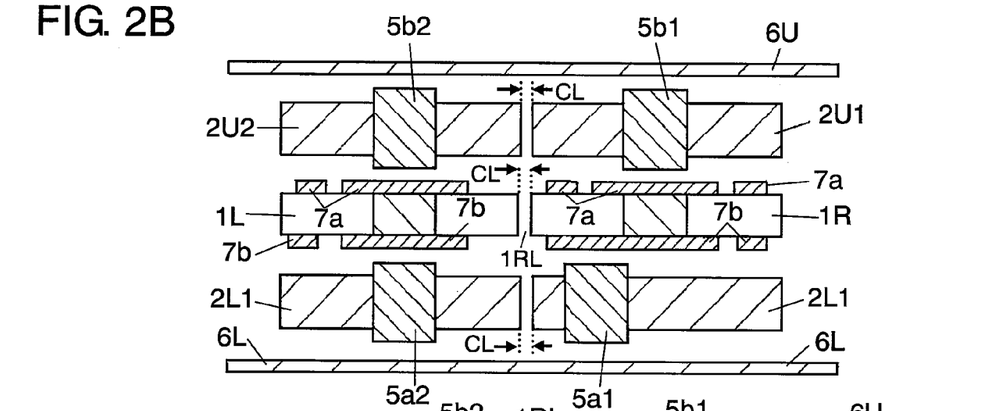
FIG. 2B is a cross sectional view showing the method for manufacturing the circuit forming substrate according to the second embodiment of the present invention.

FIG. 2B shows a state in which first and second prepregs are respectively divided into two, and are arranged side by side in correspondence to core substrate materials 1R, 1L. Such configuration is a large difference from the first embodiment. In FIG. 2B, lower side prepregs 2L1, 2L2 are arranged side by side on lower side copper foil 6L in the longitudinal direction 6LL thereof. That is, first prepregs 2L1, 2L2 are positioned on the first copper foil 6L and arranged lined (side by side). First prepregs 2L1 and 2L2 are spaced apart by a clearance dimension CL. Core substrate material 1R is then positioned with respect to prepreg 2L1 and core substrate material 1L is positioned with respect to prepreg 2L2, and stacked thereon. Core substrate materials 1R and 1L are arranged side by side. Upper side prepreg 2U1 and prepreg 2U2 are arranged side by side after upper side prepreg 2U1 is positioned on core substrate material 1R side and prepreg 2U2 is positioned on core substrate material 1L side. Copper foil 6U that is the second metal foil is then arranged on upper side prepregs 2U1, 2U2 and temporary held thereat.

In the second embodiment, the first (lower side) prepreg is divided into two pieces such as prepregs 2L1, 2L2, similar to the first embodiment. The second (upper side) prepreg is also divided into two pieces such as prepregs 2U1, 2U2. According to such configuration, the size of the core substrate material, that is, the work size in the steps is increased since the size of each prepreg is only not more than half the size of when not divided, and thus handling, stacking, and positioning of prepregs 2U1, 2U2, 2L1, and 2L2 are facilitated.

Furthermore, since the upper side prepreg is divided into two pieces such as prepregs 2U1, 2U2, the variation in the positions of conductive paste 5a1, 5a2 is suppressed small.

The variation in the positions of conductive paste 5a1, 5a2, 5b1, and 5b2 is influenced by variation etc. in the hole position in hole processing before filling prepregs 2L1, 2L2, 2U1, and 2U2 with conductive paste 5a1, 5a2, 5b1, and 5b2. However, reducing the size of prepregs 2L1, 2L2, 2U1, and 2U2 that is, dividing the prepregs into few pieces, and positioning each on core substrate materials 1R, 1L make a accuracy improvement of the positioning.

The number to divide the upper side and the lower side prepregs into can be adjusted by the desired work size and the like. For example, division into four or division into six is possible. The inventors performed various reviews and found that when the thickness of the prepreg is about 100 μm and the shape thereof is a rectangle, division of the prepreg into two or more is found to be effective if the short side thereof exceeds 350 mm.

Alternatively, a method for dividing when the short side of the prepreg exceeds 200 mm is found to be effective if the thickness of the prepreg is not more than 60 μm.

In addition, in the second embodiment, positioning of two core substrate materials 1R, 1L is performed with respect to first (lower side) prepregs 2L1, 2L2, respectively, and the positioning of two second (upper side) prepregs 2U1, 2U2 is also performed, and thus the positioning accuracy is further enhanced compared to the first embodiment even if the work size is increased and the variation in size of each member is increased since the positioning task is performed in a divided manner.

Figure 2C:
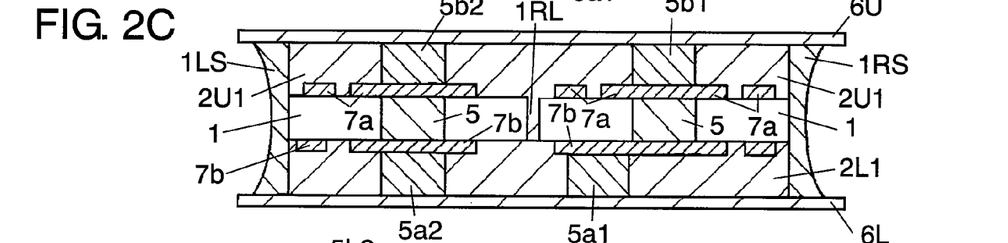
FIG. 2C is a cross sectional view showing the method for manufacturing the circuit forming substrate according to the second embodiment of the present invention.

FIG. 2C shows a state in which the circuit substrates 1R, 1L, prepregs 2U1, 2U2, 2L1, and 2L2, copper foil 6L, and copper foil 6U are temporary held by temporary holding members 1RS, 1LS. Such state is substantially the same as the state shown in FIG. 1C of the first embodiment. The large difference lies in that one part of prepregs 2U1 and 2L1 is melted and embedded in a cured state at the boundary 1RL of prepregs 1R and 1L.

Figure 2D:
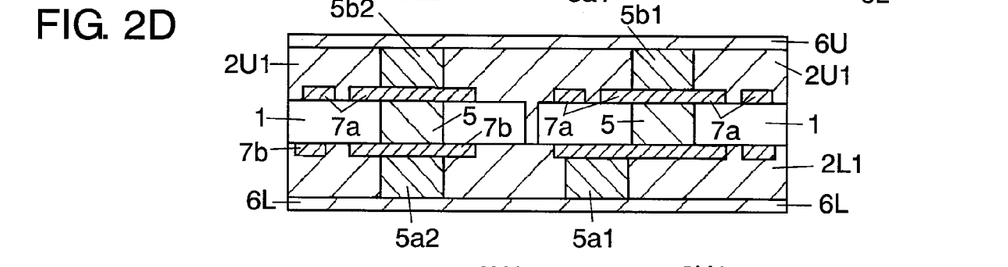
FIG. 2D is a cross sectional view showing the method for manufacturing the circuit forming substrate according to the second embodiment of the present invention.

FIG. 2D shows the four-layer circuit substrate obtained by cutting the extra portion in the vicinity of temporary holding members 1RS, 1LS. This state similarly indicates the structure shown in FIG. 2C.

Figure 2E:
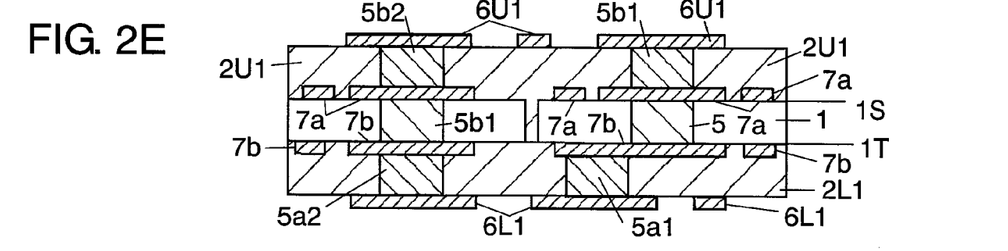
FIG. 2E is a cross sectional view showing the method for manufacturing the circuit forming substrate according to the second embodiment of the present invention.

FIG. 2E shows the four-layer circuit forming substrate after the required portions of copper foils 6U, 6L are etched and circuits 6U1, 6L1 are formed. Four-layer herein refers to circuits 6L1, 7b, 7a, and 6U1 from the lower side.

In the conventional task order, copper foils 6U, 6L are arranged and positioned from above and below after positioning and temporary holding prepregs 2U1, 2U2 on one main surface 1S side of core substrate material 1, and prepregs 2L1, 2L1 on other main surface 1T side. Thus, the handling of the substrate material is complicating and the manufacturing device also becomes complex. In the present invention, such defect is solved by the configuration and the task procedures of the circuit substrate shown in FIG. 2A to FIG. 2E. That is, the accuracy of positioning further is enhanced since the core circuit substrate is divided in correspondence to the prepregs in the second embodiment.

Third Embodiment

The third embodiment of the present invention will now be described using FIG. 3A to FIG. 3D.

Figure 3A:
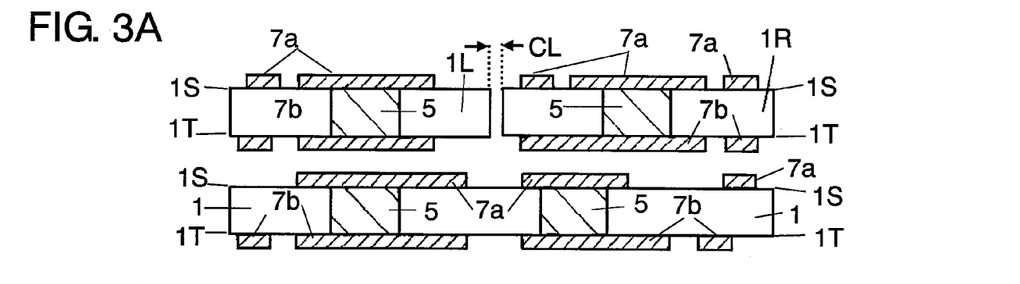
FIG. 3A is a cross sectional view showing a method for manufacturing a circuit forming substrate according to a third embodiment of the present invention.

As shown in FIG. 3A, two sets of core substrate material 1 are prepared. The first set is shown as core substrate materials 1R, 1L on the upper side of the figure. These are the same as those shown in the second embodiment, and are divided into two. The other set is core substrate material 1 on the lower side. Core substrate material 1 is substantially the same as that shown in the first embodiment. That is, the core substrate material in the third embodiment has a configuration of both first and second embodiments.

Circuits 7a are formed on the one main surface 1S of core substrate materials 1, 1R, and 1L respectively. Circuits 7b are formed on the other main surface 1T of core substrate materials 1, 1R, and 1L. Circuit 7a and circuit 7b are connected by conductive paste 5.

Figure 3B:
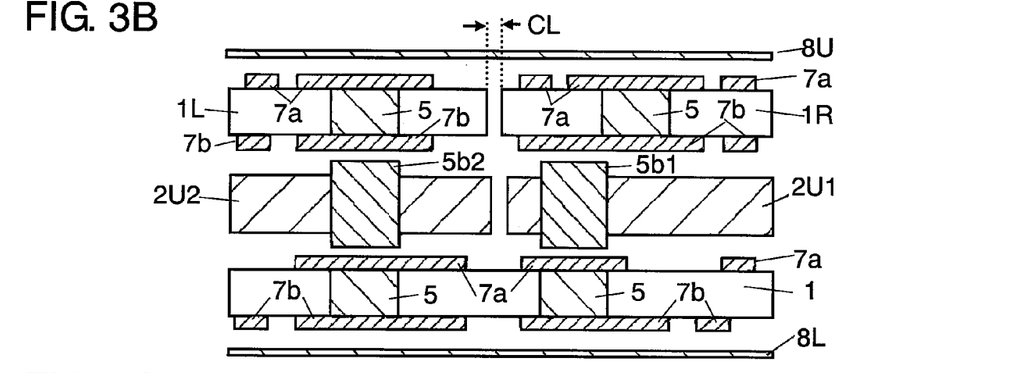
FIG. 3B is a cross sectional view showing the method for manufacturing the circuit forming substrate according to the third embodiment of the present invention.

As shown in FIG. 3B, prepreg 2U1 is arranged between core substrate material 1 and core substrate material 1R shown on the right side. Similarly, prepreg 2U2 is arranged between core substrate material 1 and core substrate material 1L shown on the left side. Prepregs 2U1 and 2U2 are arranged side by side in the longitudinal direction 8L of sheet 8L, which is a first metal foil, and core substrate material 1. Conductive pastes 5b1, 5b2 are arranged in prepregs 2U1, 2U2. Sheet 8U is arranged on circuit 7a side of core substrates 1R, 1L, and sheet 8L is arranged on circuit 7b side of core substrate 1. Integrated molding is thereafter performed by a heat press device (not shown).

Figure 3C:
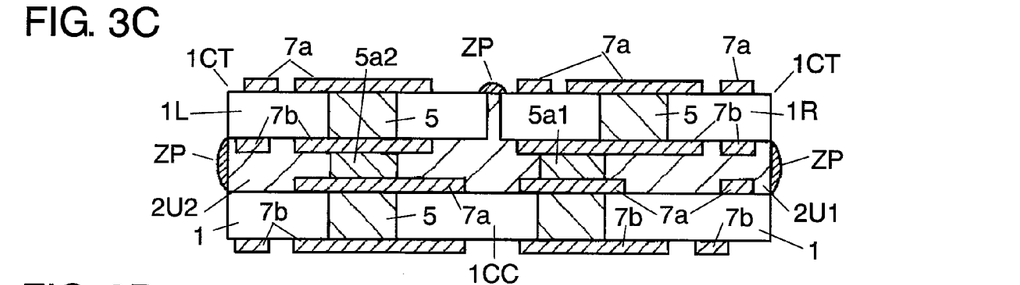
FIG. 3C is a cross sectional view showing the method for manufacturing the circuit forming substrate according to the third embodiment of the present invention.

FIG. 3C shows one example of a four layer substrate obtained after the integrated molding. Same numerals are denoted for the same regions as FIG. 2B. Exuded part ZP is formed at one part of the integrated molded circuit forming substrate by the flow of prepregs 2U1, 2U2 as shown in FIG. 3C in time of heating and pressurizing process of heat press (not shown).

Figure 3D:
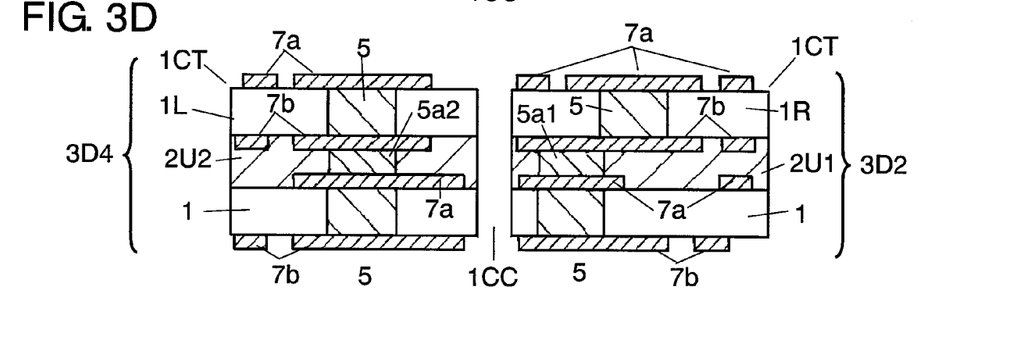
FIG. 3D is a cross sectional view showing the method for manufacturing the circuit forming substrate according to the third embodiment of the present invention.

FIG. 3D shows two sets of the four layer circuit forming substrate in which exuded part ZP is cut to be removed. Exuded part ZP is removed by cutting central part 1CC and end parts 1CT of the core substrate material, and circuit forming substrate 3D2 in which prepreg 2U1 is stacked on core substrate material 1 and core substrate material 1R is stacked thereon is obtained. Similarly, circuit forming substrate 3D4 in which prepreg 2U2 is stacked on core substrate material 1, and core substrate material 1L is stacked thereon is obtained. Circuit forming substrates 3D2 and 3D4 are molded to substantially the same size.

If the configuration and the manufacturing method shown in FIG. 3A to FIG. 3D according to the third embodiment are used, a manufacturing method excelling in productivity can be provided since an eight layer circuit forming substrate and the like can also be relatively easily manufactured by laminating two of the four layer circuit forming substrates.

The B stage substrate material has been handled as the prepreg in manufacturing the multi-layer circuit forming substrate of four or more layers in the above description. However, in addition to the prepregs made to the B stage by immersing epoxy resin and the like in glass fiber woven cloth and aramid fiber, a wide variety of materials such as that in which the B stage resin layer is arranged on a film such as polyimide, B stage resin sheet that does not use reinforcement material, thermoplastic resin sheet, adhesive sheet made of inorganic material etc. may be used.

The number to divide the core substrate material into is not limited to two and may be three or more. In addition to the stacked layer of four plates, an arbitrary number of layers are realized through the combination of the core substrate material and the prepregs. A configuration of a stacked plate in which two or more prepregs are superimposed may also be adopted.

The prepreg in which the inter-layer connecting part is not arranged may also be used.

Various metal materials other than copper may be used for the metal foil. For instance, nickel, gold, aluminum, and the like may be used. Moreover, application to that in which a separator for supporting the metal foil is laminated, that in which the metal foil is etching processed to be formed as a circuit, and the like is also possible depending on the various applications.

Regarding the core substrate material, aramid epoxy material, flexible substrate material, inorganic material such as ceramic substrate may also be used other than the normal glass epoxy substrate material.

Note that the clearance dimension CL between the divided prepreg and another prepreg adjacent thereto, and the clearance dimension CL between the core substrate material and another substrate material adjacent thereto, that is, the clearance dimension CL of the portion filled by the prepreg when flowed will be described below.

If the clearance dimension CL is too large, the prepregs flow, whereby the resin and the like cannot be sufficiently filled, which arises defects such as penetration of etchant when forming circuits 7a, 7b. Thus, it is important to appropriately set the clearance dimension CL. In particular, the size is preferably set after checking that a void is not formed between prepregs 2U1 and 2U2 or between prepregs 2L1 and 2L2 adjacent to each other in the manufacturing step shown in FIGS. 3A and 3B.

Clearance dimension CL is desirably made as small as possible. However, if the clearance dimension is too small, the prepregs or the core substrate materials adjacent to each other may contact in the stacking task. The inventors have performed various reviews and obtained a satisfactory result when clearance dimension CL is between 3 mm to 0.2 mm. Particularly, 1 mm to 0.5 mm is desirable in terms of filling resin etc., workability, and ensuring movable range in positioning. Note that clearance dimension CL may be appropriately set according to the thickness of the prepreg and the core substrate material, and furthermore, to the application of various electronic equipments.

Fourth Embodiment

FIG. 4A to FIG. 4D are cross sectional views showing the method for manufacturing a circuit forming substrate according to a fourth embodiment of the present invention.

Figure 4A:
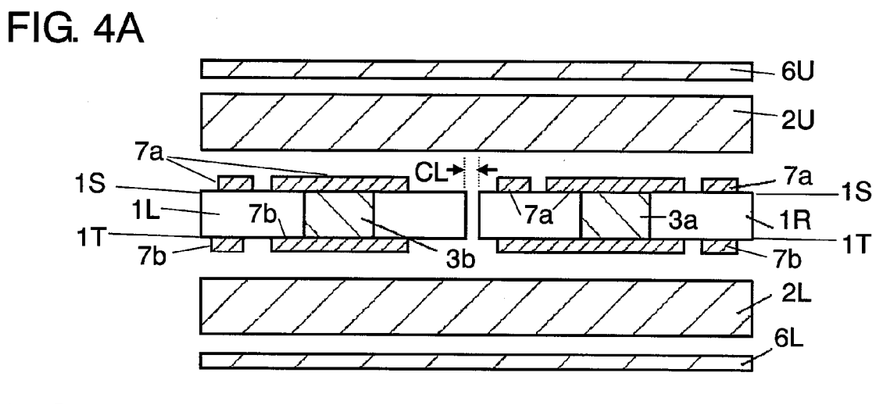
FIG. 4A is a cross sectional view showing a method for manufacturing a circuit forming substrate according to a fourth embodiment of the present invention.

In FIG. 4A, core substrate materials 1R, 1L are prepared for the C stage substrate material. Similar to the first to third embodiments, circuits 7a, 7b are respectively formed on one main surface 1S and the other main surface 1T of core substrate materials 1R, 1L. Circuit 7a and circuit 7b are connected by inter-layer connecting parts 3a, 3b. Inter-layer connecting parts 3a, 3b are specifically conductive paste.

Core substrate materials 1R, 1L are illustrated as a double-sided substrate including conductive paste for inter-layer connecting parts 3a, 3b, but a multi-layer circuit substrate may be used. If manufacturing of core substrate materials 1R, 1L is difficult, two core circuit forming substrates 1R, 1L, for example, are prepared so that manufacturing becomes relatively easy. In particular, increasing the work size often tends to become difficult as the thickness of core substrate materials 1R, 1L becomes thinner. In this case, two core substrate materials 1R, 1L are arranged side by side close to each other with predetermined clearance dimension CL, and are then sandwiched by prepregs 2U, 2L, which are the B stage substrate materials, from above and below, and further sandwiched by copper foils 6L, 6U serving as metal foils so as to be in a stacked state.

Temporary holding with heater tool (not shown) and the like according to the thickness or the size (area) of core substrate materials 1R, 1L and prepregs 2U, 2L is also effective.

Positioning of prepregs 2L, 2U can be rough since inter-layer connecting parts etc. are not arranged in the fourth embodiment. However, it is effective to arrange positioning marks and the like on prepregs 2L, 2U to perform positioning of each other in view of the subsequent manufacturing steps and in order to enhance the positioning accuracy. If the inter-layer connecting part such as conductive paste is formed in prepregs 2L, 2U, positioning between the prepregs 2U, 2L and the core substrate materials 1R, 1L becomes important.

Figure 4B:
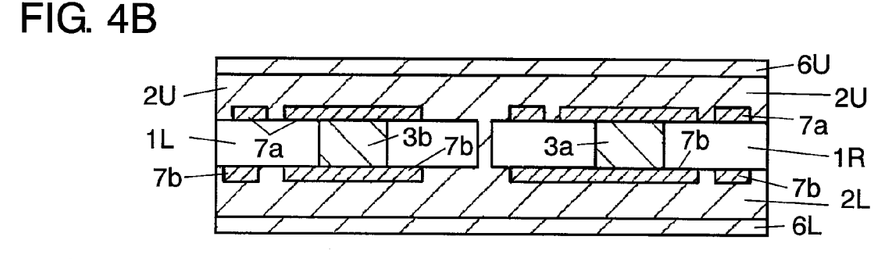
FIG. 4B is a cross sectional view showing the method for manufacturing the circuit forming substrate according to the fourth embodiment of the present invention.

FIG. 4B shows an intermediate circuit forming substrate molded by heating and pressurizing with a heat press (not shown) and the like after stacking prepregs 2L, 2U, core material substrates 1R, 1L, and copper foils 6L, 6U according to the manufacturing step order shown in FIG. 4A.

Figure 4C:
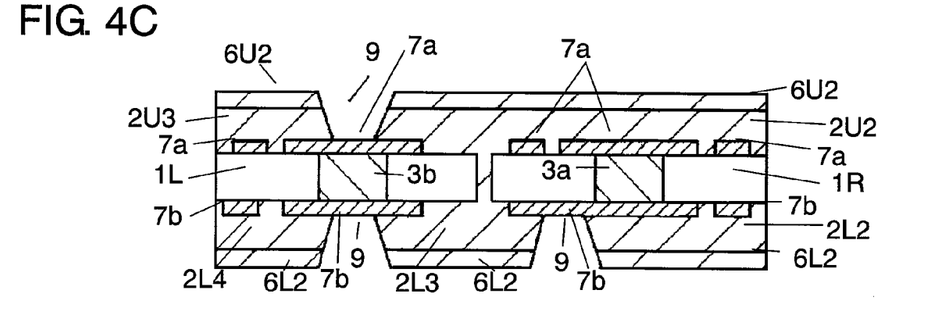
FIG. 4C is the cross sectional view showing the method for manufacturing a circuit forming substrate according to the fourth embodiment of the present invention.

FIG. 4C shows a state of processing laser via hole 9 through laser processing method and the like in each stacking object forming the circuit forming substrate. In FIG. 4C, one example of performing laser processing on the stacking object such as prepregs 2L, 2U, and core material substrates 1R, 1L shown in FIG. 4B to expose predetermined circuits 7a, 7b is shown. Copper foils 6L, 6U are partially divided by laser processing, and a plurality of copper foils 6L2, 6U2 is formed. Prepregs 2L, 2U are also divided, and prepregs 2L2, 2U3 are partially formed. Circuits 7a, 7b appear in laser via hole 9 by laser processing.

Figure 4D:
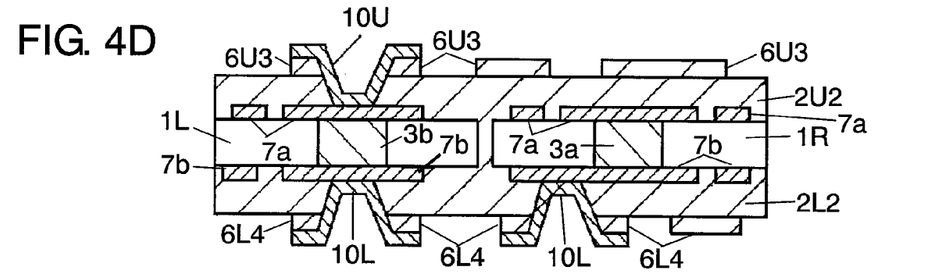
FIG. 4D is a cross sectional view showing the method for manufacturing the circuit forming substrate according to the fourth embodiment of the present invention.

FIG. 4D shows a state in which laser via 10L, 10U are formed after processing laser via hole 9 shown in FIG. 4C. Laser via 10L, 10U and copper foils 6U3, 6L4 are formed using steps such as copper plating, pattern forming, and the like. The state shown in FIG. 4D shows a multi-layer circuit forming substrate.

The manufacturing step shown in FIG. 4C to FIG. 4D is a construction method generally referred to as prepreg build up method and a method that is relatively easy to apply even when the work size is large, and obviously, the cost per unit area can be reduced the larger the work size.

Fifth Embodiment

Figure 5A:
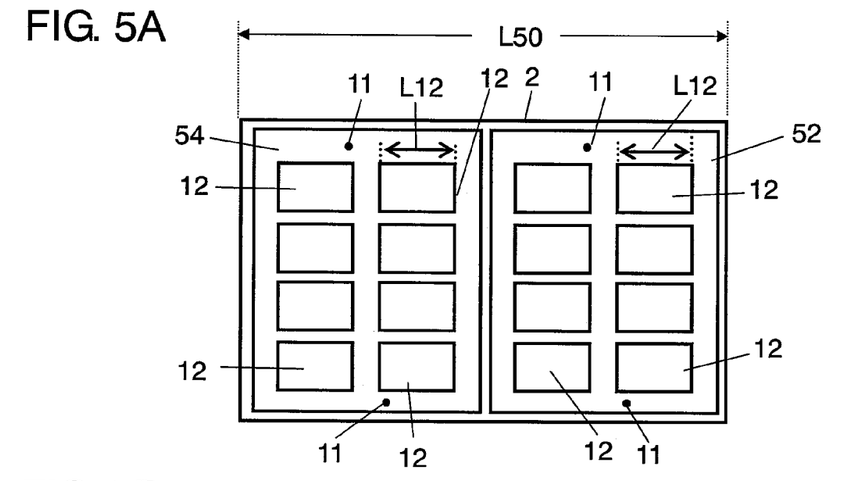
FIG. 5A is a plan views showing a method for manufacturing a circuit forming substrate according to a fifth embodiment of the present invention.
Figure 5B:
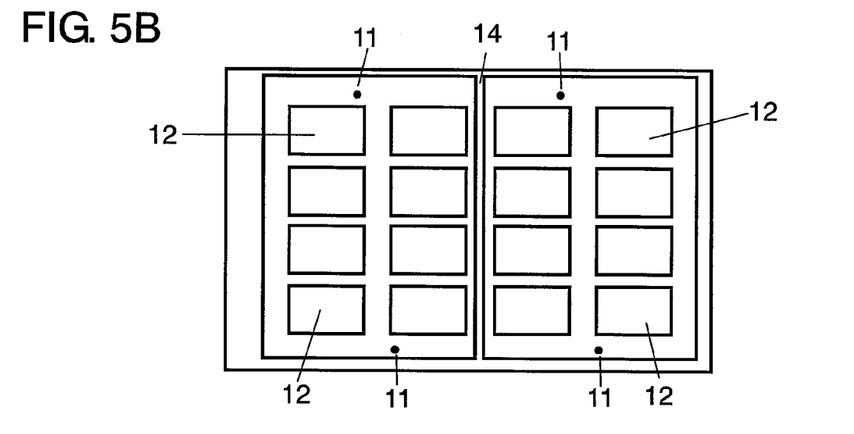
FIG. 5B is a plan view showing the method for manufacturing the circuit forming substrate according to the fifth embodiment of the present invention.
Figure 5C:
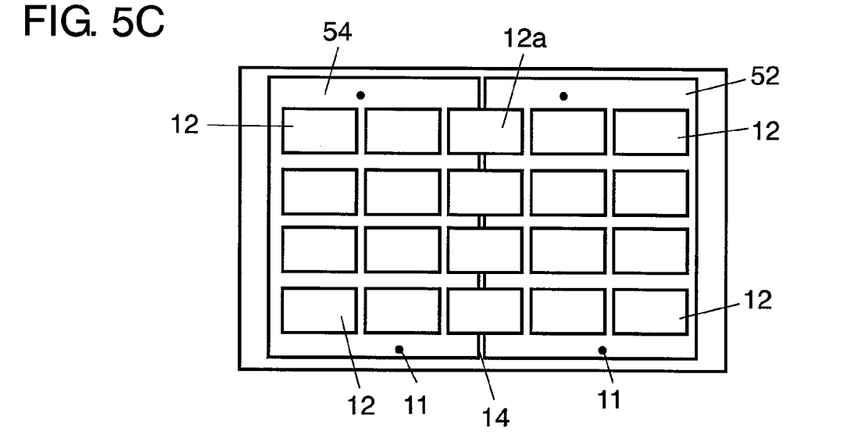
FIG. 5C is a plan view showing the method for manufacturing the circuit forming substrate according to the fifth embodiment of the present invention.

FIG. 5A to FIG. 5C show a method for manufacturing a circuit substrate according to the fifth embodiment of the present invention. The circuit forming substrate shown in the fifth embodiment can be manufactured with one of the methods of first to fourth embodiments.

As shown in FIG. 5A, circuit forming substrate 12 generally used as a product is smaller than the work size in time of manufacturing. As shown in FIG. 5A, most of the times, individual assembled circuit forming substrate 12 is obtained from the state of work size in which a plurality of assembled circuit forming substrates 12 is arranged over the surface by being cut out with die punching, rooter processing, and the like. Furthermore, assembled circuit forming substrate 12 is generally configured from a plurality of individual circuit forming substrates 13a, 13b (to be hereinafter described).

In this case, the consistency between the work size and the size of the assembled circuit forming substrate (hereinafter described as product size) greatly influences the product cost.

That is, if length L12 of one side of the product size is 100 mm when size L50 in the left and right direction shown in FIG. 5A is about 500 mm, efficient designing can be performed if two assembled circuit forming substrates 52, 54 are arranged side by side in the left and right direction even when the non-effective portion such as tool mark 11 is excluded, as shown in the figure of the circuit forming substrate seen from above in FIG. 5A.

However, the assembled circuit forming substrate must be arranged so as to ride over two core substrate materials 52, 54 when length L12 of the product size is about 150 mm or when the assembled circuit forming substrate is desired to be arranged as much as possible.

In order to realize such arrangement, it is effective to cut the contacting sides of two core forming substrate materials 52, 54 at satisfactory precision in advance, and have the space between two core forming substrate materials 52, 54 as small as possible.

FIG. 5B shows an example in which core forming substrate materials 52, 54 are cut before the stacking step. Specific site 14, where two core forming substrate materials 52, 54 contact, is the site where the assembled circuit forming substrates 12 are adjacent to each other.

FIG. 5C shows an example in which assembled circuit forming substrate 12a is arranged so as to ride over the two core substrate materials 52, 54.

Generally, a plurality or individual circuit forming substrates worth one portable telephone or a set of digital still camera is often arranged in the assembled circuit forming substrate. Generally, it is mounted to the electronic component in the state of assembled circuit forming substrate 12, and thereafter, divided into the individual circuit forming substrate for each final product in terms of mounting efficiency in assembling the set.

Figure 6:
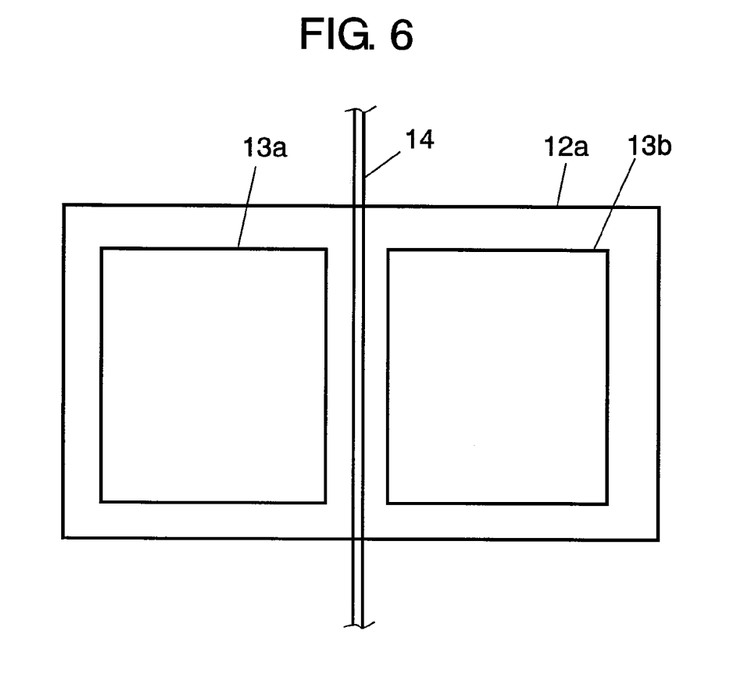
FIG. 6 is a plan view showing the method for manufacturing the circuit forming substrate according to the fifth embodiment of the present invention.

FIG. 6 shows a view of assembled circuit forming substrate 12a seen from above. Designing is desirably carried out so that specific site 14, where the two core substrate materials contact, is positioned between individual circuit forming substrates 13a, 13b.

Figure 7:
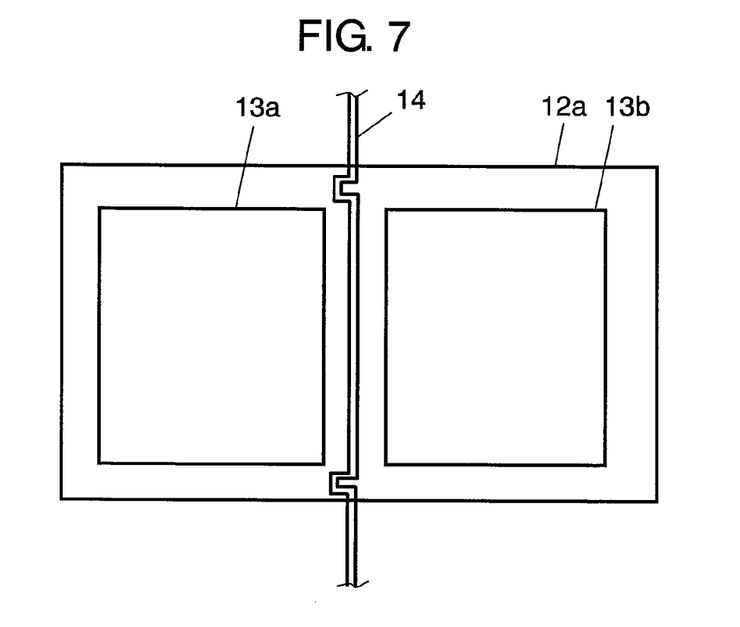
FIG. 7 is a plan view showing the method for manufacturing the circuit forming substrate according to the fifth embodiment of the present invention.

Specific site 14 of core substrate materials 52, 54 is shown in a linear shape in FIG. 6. However, specific site 14 may be effectively formed into a shape two individual circuit forming substrates 13a, 13b fit with each other as shown in FIG. 7 to increase the strength of the circuit forming substrate in the product state.

The inventors performed various reviews and found as a result that dicing method can be used for the cutting method, and the space between two individual circuit forming substrates 13a, 13b can be 100 µm.

Various methods can be adopted for the cutting method such as using slitter blade, cutting method by laser beam and the like in addition to the dicing method.

Two core substrate materials are stacked with respect to one prepreg in the fifth embodiment. However, the number of core substrate materials may be three or more. Furthermore, a wide variety of combinations may be used such as arranging the two prepregs side by side and stacking a plurality of core substrate materials.

Moreover, a high multi-layer circuit forming substrate may be manufactured by stacking the combination of prepreg and core substrate material in a multiple steps in the thickness direction.

INDUSTRIAL APPLICABILITY

As described above, according to the method for manufacturing the circuit forming substrate of the present invention, the handling of the substrate material is stabilized even when the work size in time of manufacturing the circuit forming substrate is increased. The circuit forming substrate can be manufactured using a thin substrate material of large size, and in consequence, high density circuit forming substrate of high quality can be provided while significantly enhancing the reliability of electrical connection between the layers using an inter-layer connecting part such as conducive paste, and thus industrial availability is high.

The invention claimed is:

1. A method for manufacturing a circuit forming substrate, comprising:
   positioning, arranging side by side, and temporary holding a plurality of first B stage state substrate materials on an upper surface of a first metal foil;
   positioning, mounting, and temporary holding a C stage state substrate material on upper surfaces of the plurality of first B stage state substrate materials;
   positioning, mounting, and temporary holding a plurality of second B stage state substrate materials on an upper surface of the C stage state substrate material; and
   mounting and temporary holding a second metal foil on upper surfaces of the plurality of second B stage state substrate materials.

2. The method according to claim 1, further comprising:
   after said positioning, arranging side by side, and temporary holding the plurality of first B stage state substrate materials, after said positioning, mounting, and temporary holding the C stage state substrate material, after said positioning, mounting, and temporary holding the plurality of second B stage state substrate materials, and after said mounting and temporary holding the second metal foil, fixing the first and second metal foils, a side surface of one of the plurality of first B stage state substrate materials, a side surface of one of the plurality of second B stage state substrate materials, and a side surface of the C stage state substrate material with a temporary holding member.

3. The method according to claim 1, wherein a clearance dimension between the plurality of first B stage state substrate materials is in a range of 3 mm to 0.2 mm in said positioning, arranging side by side, and holding the plurality of first B stage state substrate materials.

4. The method according to claim 1, wherein the plurality of first B stage state substrate materials and the plurality of second B stage state substrate materials are B stage state prepregs, and are formed into two or more portions by being divided from that having a thickness of not more than 100 µm and a short side of a rectangular shape exceeding 350 mm, or that having a thickness of not more than 60 µm and one side exceeding 200 mm.

5. The method according to claim 1, wherein each of the plurality of first B stage state substrate materials includes a woven cloth for reinforcement material.

6. The method according to claim 1,
   wherein the C stage state substrate material includes
      a first circuit provided at the upper surface of the C stage state substrate material,
      a second circuit provided at a lower surface of the C stage state substrate material, and
      an inter-layer connecting part formed by conductive paste between the upper surface and the lower surface of the C stage state substrate material to connect the first circuit to the second circuit.

7. The method according to claim 6, further comprising:
   forming a laser via in one of the plurality of B stage state substrate materials, the laser via being connected to the first circuit.

8. The method according to claim 1, wherein at least one of the plurality of B stage state substrate materials includes an inter-layer connecting part in said positioning, arranging side by side, and temporary holding the plurality of first B stage state substrate materials.

9. The method according to claim 1, wherein a clearance dimension between the plurality of second B stage state substrate materials is in a range of 3 mm to 0.2 mm in said positioning, arranging side by side, and temporary holding the plurality of second B stage state substrate materials.

10. A method for manufacturing a circuit forming substrate, comprising:
    stacking a plurality of C stage state substrate materials side by side on an upper surface of a B stage state substrate material; and
    stacking the B stage state substrate material on an upper surface of a metal foil.

11. The method according to claim 10,
wherein said circuit forming substrate includes a plurality of assembled circuit forming substrates each including a plurality of individual circuit forming substrates, and
wherein, in said stacking the plurality of C stage state substrate materials side by side on the upper surface of the B stage state substrate material, the plurality of C stage state substrate materials contact each other at a position between individual circuit forming substrates adjacent to each other out of the plurality of individual circuit forming substrates in at least one assembled circuit forming substrate.

12. The method according to claim 10, further comprising:
cutting and dividing a C stage state substrate material into the plurality of C stage state substrate materials before said stacking the plurality of C stage state substrate materials.

13. The method according to claim 12, wherein said cutting and dividing the C stage state substrate material into the plurality of C stage state substrate materials comprises cutting and dividing the C stage state substrate material by a dicing method.

14. The method according to claim 10,
wherein one of the plurality of C stage state substrate materials includes
a first circuit provided at an upper surface of said one of the plurality of the C stage state substrate materials,
a second circuit provided at a lower surface of said one of the plurality of the C stage state substrate materials, and
an inter-layer connecting part formed by conductive paste between the lower surface and the upper surface of said one of the plurality of C stage state substrate materials.

15. The method according to claim 14, further comprising:
forming a laser via in the B stage state substrate material, the laser via being connected to the second circuit.

16. The method according to claim 10,
wherein the plurality of C stage state substrate materials contact each other, and
wherein portions of the plurality of C stage state substrate materials that contact each other have shapes fit to each other.

* * * * *